(12) United States Patent
Gossmann et al.

(10) Patent No.: US 6,358,824 B1
(45) Date of Patent: Mar. 19, 2002

(54) INTEGRATED CIRCUITS WITH TUB-TIES AND SHALLOW TRENCH ISOLATION

(75) Inventors: Hans-Joachim Ludwig Gossmann, Summit; Thi-Hong-Ha Vuong, Berkeley Heights, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/706,319

(22) Filed: Nov. 3, 2000

(51) Int. Cl.$^7$ .............................................. H01L 21/425
(52) U.S. Cl. ...................................... 438/525; 438/199
(58) Field of Search ................................ 438/199, 223, 438/224, 227, 228, 525, 243, 386, 289, 291

(56) References Cited

U.S. PATENT DOCUMENTS

| | | | |
|---|---|---|---|
| 4,905,073 A | | 2/1990 | Chen et al. .................... 357/67 |
| 5,571,745 A | | 11/1996 | Horiuchi ....................... 437/57 |
| 5,786,620 A | * | 7/1998 | Richards, Jr. et al. ...... 257/408 |
| 5,949,112 A | * | 9/1999 | Gossmann et al. ......... 257/369 |
| 5,959,322 A | * | 9/1999 | Lee ............................ 257/298 |
| 6,054,342 A | * | 4/2000 | Gossmann et al. ......... 438/199 |

OTHER PUBLICATIONS

U. Schwalke et al., *Extigate.* . . , 27$^{th}$ European Solid–State Research Conference, Stuttgart, Germany, Sep. 22–24, 1996, pp. 317–320.
U. Schwalke et al., *Advanced Gate–Stack.* . . , 1997 Symposium on VLSI Technology, Jun. 10–12, 1997, Digest of Technical Papers, pp. 71–72.
C. P. Chang et al., *A Highly Manufacturable.* . . , 1997 IEDM, Dec. 7–19, 1997, Technical Digest., pp. 661–665 (1997).

* cited by examiner

Primary Examiner—David Nelms
Assistant Examiner—Phuc T. Dang
(74) Attorney, Agent, or Firm—Michael J. Urbano

(57) ABSTRACT

A method of fabricating an IC comprises the steps of: (a) forming trench isolation regions in a surface of a semiconductor body; and (b) forming a tub-tie region between at least one pair of the trench isolation regions (when viewed in cross-section) by a process that includes the following steps: (b1) forming a first photolithographic mask that covers and is in registration with the tub-tie region; (b2) implanting ions of a first conductivity-type to form a tub region adjacent the tub-tie region; (b3) removing the first mask; (b4) forming a second photolithographic mask that has an opening that exposes most of the underlying tub-tie region but overlaps a first peripheral section on one side of the tub-tie region; (b5) implanting ions to form a pedestal portion of a second conductivity-type within the tub-tie region; and (b6) implanting ions of the first conductivity-type at an acute (preferably non-zero) angle $-\oplus$ with respect to the normal to the surface to the body so as to form a conductivity-type localized first zone that extends into the first peripheral section. In a preferred embodiment, the first conductivity-type tub of step (b2) and the second conductivity-type pedestal of step (b5) are formed by implanting ions at an acute (non-zero) angle $+\beta$ to the normal to the surface of the body. In another embodiment, between steps (b1) and (b3), the cap portion is angle-implanted to form a highly doped peripheral localized second zone of the second conductivity type located adjacent a different portion of one of said isolating regions. The second zone prevents any significant amount of charge build-up from taking place in the pedestal portion.

3 Claims, 4 Drawing Sheets

INTEGRATED CIRCUITS WITH TUB-TIES AND SHALLOW TRENCH ISOLATION

FIELD OF THE INVENTION

This invention relates generally to integrated circuits (ICs) and, more particularly, to a design of ICs with tub-ties and shallow trench isolation (STI) and to a process for making them.

BACKGROUND OF THE INVENTION

In conventional CMOS (complementary metal oxide semiconductor) technology NMOS transistors are embedded in a p-type tub (or well), and, conversely, PMOS transistors are embedded in an n-type tub (or well). Each tub serves to isolate the transistors therein from the bulk substrate and from transistors in the other tub. However, the tubs should not be left floating; i.e., they should be connected to either $V_{cc}$ or to ground in order to prevent latch-up. For this purpose special conducting paths, known as tub-ties, establish ohmic connections between appropriate metal layers (the tub-tie contacts) and each of the tubs. Not every transistor needs a tub-tie, but every tub needs at least one tub-tie. Typically, the area of a tub-tie at the surface of the semiconductor is relatively small, measuring only about 1 $\mu m \times 1$ $\mu m$. In LOCOS (local oxidation of silicon) isolation the tub-tie is formed in zones of silicon located between regions of isolating field oxide (FOX) when viewed in cross-section, whereas in STI (shallow trench isolation) it is formed in small pillars of silicon disposed between isolating oxide-filled trenches when viewed in cross-section.

In standard CMOS front-end processing (i.e., processing up to but not including metalization), which usually entails about ten different photolithographic mask steps to fabricate the transistors, the source/drain (S/D) regions are typically doped heavily, whereas the tubs are only lightly doped. The tub-tie regions are also heavily doped, usually during the same ion implantation step that dopes the S/D regions. Doping of the n-type tub-tie region of the PMOS transistors, for example, is accomplished by opening a hole over the tub-tie location in the photoresist (PR) mask that protects the PMOS transistor locations during the n-type ion implantation of the S/D regions of the NMOS transistors. Conversely, doping of the p-type tub-tie region of the NMOS transistors is accomplished by opening a hole over the tub-tie location in the PR mask that protects the NMOS transistor locations during the p-type ion implantation of the S/D regions of the PMOS transistors.

However, IC fabrication processes that require a large number of PR mask steps are undesirable, in general implying lower yields and higher cost than processes that utilize fewer PR mask steps. Consequently, workers in the IC art have endeavored to reduce the number of PR mask steps required. See, for example, T. Horiuchi, U.S. Pat. No. 5,571,745 issued on Nov. 5, 1996, U. Schwalke et al., *European Solid-State Device Research Conference*, Conf. Proc., pp. 317–320 (1996), and U. Schwalke et al, *Symposium On VLSI Technology,* Digest of Technical Papers, pp. 71–73 (1997). While the various prior art implementations differ, they all accomplish PR mask reduction by combining two or more implant steps, such as tub implants with gate implants. The most aggressive approach, which entails the largest cost reduction, combines all implants into a single PR mask step. However, in so doing the PR mask previously utilized to allow selective doping of the tub-tie regions is no longer available. We addressed the problem of reducing mask-count yet enabling tub-tie regions to be formed in U.S. Pat. No. 5,949,112 issued to us on Sep. 7, 1999 (hereinafter the Gossmann-Vuong patent), which is incorporated herein by reference.

The Gossmann-Vuong patent describes the structure of an IC that comprises a tub of a first conductivity type, at least one transistor embedded in the tub, and a first pair of isolating regions defining therebetween a tub-tie region coupled to the tub. The tub-tie region comprises a cap portion of the first conductivity type and an underlying buried pedestal portion of a second conductivity type. At least a top section of the pedestal portion is surrounded by the cap portion so that a conducting path is formed between the cap portion and the tub. In a CMOS IC an n-type tub tie of this design is provided for PMOS transistors in n-type tubs, and a p-type tub-tie of this design is provided for NMOS transistors in p-type tubs. In a preferred embodiment, the cap portion of each tub-tie comprises a relatively heavily doped central section and more lightly doped peripheral sections, both of the same conductivity type.

The Gossmann-Vuong patent also describes a reduced-mask-count process for making CMOS ICs. The process includes forming the isolating regions so that each has a protrusion which extends over the surface regions where the peripheral sections of the cap portion are to be formed. Then, a combination of ion implantation energies and concentrations, as well as suitable PR masking, in conjunction with the shape of the isolating regions, enables selective doping of the pedestal portion and the cap portion (central and peripheral sections). Illustratively, the isolating regions are FOX regions formed by a LOCOS process or TROX (trench oxide) regions formed by an STI process.

In the STI process described in the Gossmann-Vuong patent, FIG. 9B (FIG. 1B herein) shows that the isolating regions 120 and 122 have reduced-thickness protrusions 120.1 and 122.1, respectively, that extend over the peripheral sections 161.1 of the tub-tie. Ion-implantation is performed to produce the various regions of the tub-tie (as well as the source/drain/extensions etc.). The direction of these implantation steps is perpendicular to the top surface of the IC wafer. Although this approach is a considerable advance over prior art techniques, there is still room for improvement in several areas: first, formation of the protrusions 120.1 and 122.1 requires an extra photolithographic masking step; second, tight control of mask alignment is required to avoid pinch-off; i.e., in the case of a p-type tub-tie, avoiding an n-type conducting path between the n-type pedestal portion 162 and the isolation regions 120 and 122, and vice-versa; and third, the tub-tie pedestal portions 152 and 162 are electrically floating and hence tend to accumulate charge that can result in an unpredictable transient behavior of the IC.

Thus, a need still remains in the art of making IC tub-ties for a further reduced-mask-count STI IC process.

A need also remains for such a process, and corresponding tub-tie design, that decreases the likelihood of pinch-off of the tub-tie.

In addition, a need remains for such a process, and corresponding tub-tie design, that reduces charge build-up in the pedestal regions.

SUMMARY OF THE INVENTION

In accordance with one aspect of our invention, a method of fabricating an IC comprises the steps of: (a) forming trench isolation regions in a surface of a semiconductor body; and (b) forming a tub-tie region between at least one pair of the trench isolation regions (when viewed in cross-section) by a process that includes the following steps: (b1) forming a first photolithographic mask that covers and is in registration with the tub-tie region; (b2) implanting ions of a first conductivity-type to form a tub region adjacent the tub-tie region; (b3) removing the first mask; (b4) forming a second photolithographic mask that has an opening that exposes most of the underlying tub-tie region but overlaps a first peripheral section on one side of the tub-tie region; (b5) implanting ions to form a pedestal portion of a second conductivity-type within the tub-tie region; (b6) implanting ions of the first conductivity-type at an acute (preferably non-zero) angle $-\alpha$ with respect to the normal to the surface to the body so as to form a first conductivity-type localized first zone that extends into the first peripheral section; and (b7) forming an electrode in contact with the tub-tie region.

In a preferred embodiment, the first conductivity-type tub of step (b2) and the second conductivity-type pedestal of step (b5) are formed by implanting ions at an acute (non-zero) angle $+\beta$ to the normal to the surface of the body.

In yet another embodiment, between steps (b1) and (b3) ions of the second conductivity type are implanted at an acute angle $-\alpha$ to the normal to said surface so as to form a second conductivity-type, highly doped localized second zone that extends into a second peripheral region so as to make ohmic contact between the electrode and the pedestal portion.

In accordance with another aspect of our invention, an integrated circuit comprises: a tub of a first conductivity type disposed in a semiconductor body having a top major surface, at least one transistor embedded in the tub, a pair of shallow trench isolating regions, and a tub-tie region disposed between the isolating regions when viewed in cross-section. The tub-tie region includes a cap portion and an underlying pedestal portion of a second conductivity type. The cap portion contacts at least a top section of the pedestal portion and has at least a section of the first conductivity type that forms a conducting path between the cap portion and the tub, characterized in that the pedestal portion is oriented at approximately an acute (non-zero) angle $+\beta$ to the normal to said surface, and the cap portion includes a highly doped peripheral first zone of the first conductivity type located adjacent a portion of one of said isolating regions. The peripheral first zone reduces the likelihood of pinch-off.

In another embodiment of this aspect of our invention, the cap portion includes a highly doped peripheral second zone of the second conductivity type located adjacent a different portion of one of the isolating regions. The second peripheral zone prevents any significant amount of charge build-up in the pedestal portion.

BRIEF DESCRIPTION OF THE DRAWING

Our invention, together with its various features and advantages, can be readily understood from the following more detailed description taken in conjunction with the accompanying drawing, in which:

FIGS. 1–2 are schematic, cross-sectional views of a portion of a CMOS IC depicting a design of a prior art tub-tie as described in the Gossmann-Vuong patent;

FIG. 3A shows the IC after ion-implantation of $n^+$-type source/drain/extension regions and p-type tub regions; FIG. 3B shows the same portion of the IC after ion-implantation of $p^+$-type source/drain/extension regions and n-type tub regions; and FIG. 3C shows a composite of FIGS. 3A and 3B with a tub-tie electrode in place.

In the interest of clarity and simplicity, these figures are not drawn to scale. Moreover, for purposes of clarity only, in the Detailed Description that follows, a double dash is used in the exponents of the conductivity terms $n^{--}$-type and $p^{--}$-type because a single dash is difficult to see. The double dash exponent is intended to designate that the semiconductor is lightly doped, but not necessarily that it is very lightly doped (contrary to the normal usage in the IC art).

DETAILED DESCRIPTION OF THE INVENTION

General Tub-Tie Structure and Fabrication

Figure 1A:
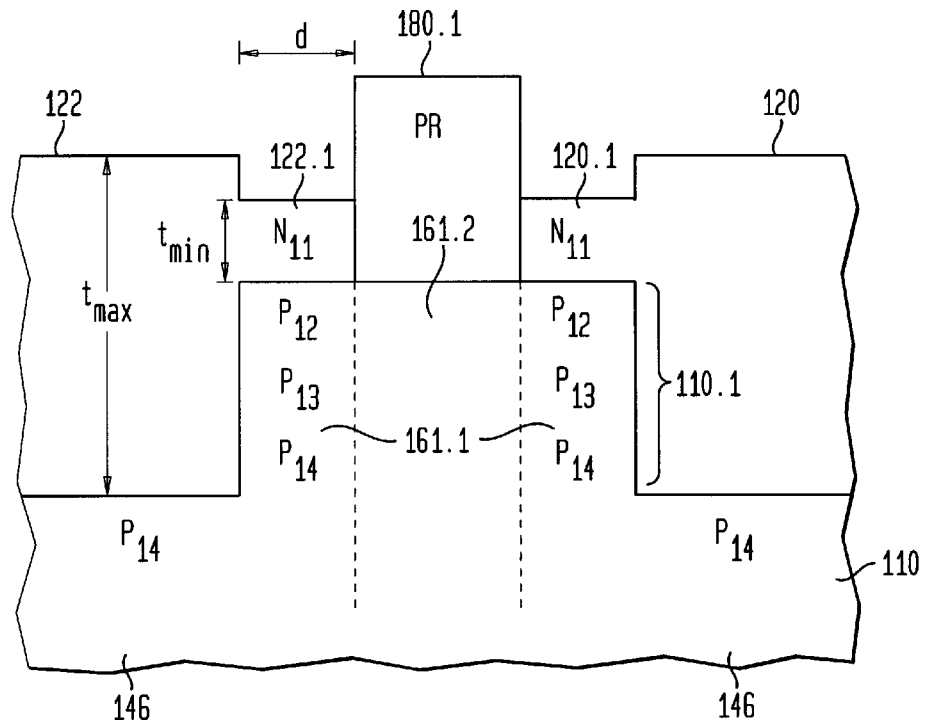
FIGS. 1A and 1B (corresponding to FIGS. 9A and 9B of the patent) show a p-type tub-tie at different stages of its fabrication, whereas FIGS. 2A and 2B (corresponding to FIGS. 10A and 10B of the patent) show an n-type tub at the same stages as FIGS. 1A and 1B, respectively.
Figure 1B:
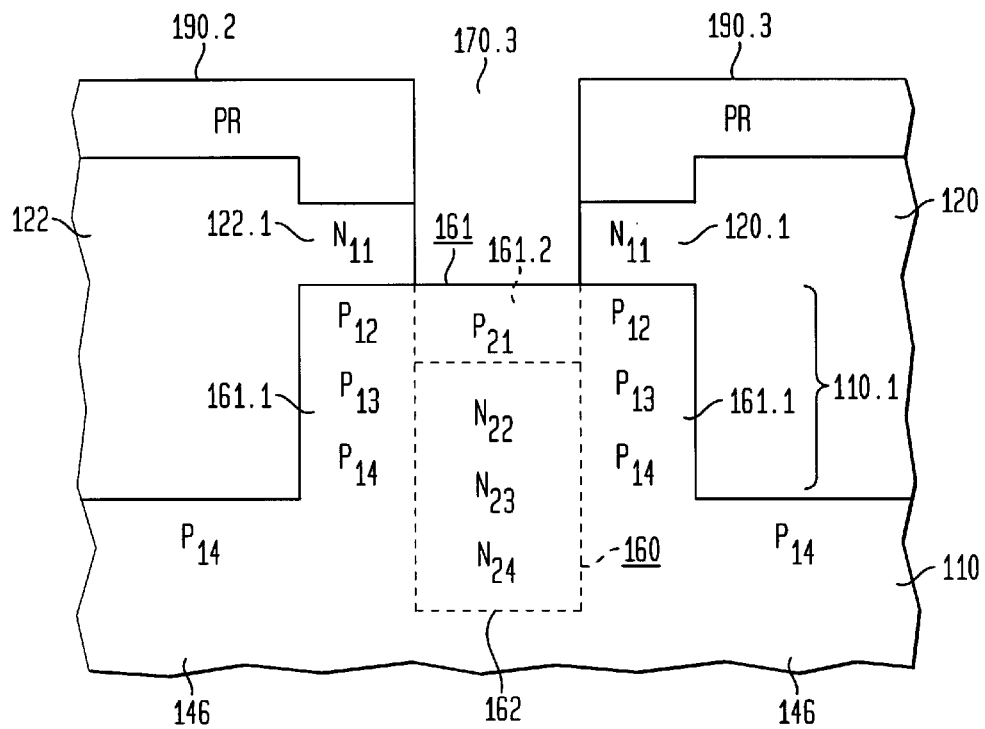

Beginning first with FIG. 1B, we show schematically a p-type tub-tie realized by a reduced-mask-count IC process described in the Gossmann-Vuong patent. The tub itself is designated 146, the tub-tie contact (not shown) would be formed in opening 170.3, and the tub-tie region 160 includes a pedestal portion 162 and a cap portion 161. The latter electrically couples (i.e., ties) the contact to the tub. More specifically, the IC includes a semiconductor body 110 having a raised feature 110.1 in which the tub-tie region is to be formed. The raised feature is bounded by electrically isolating regions 120 and 122 each of which has a protrusion 120.1 and 122.1, respectively, overlaying peripheral sections 161.1 of feature 110.1 and hence of the tub-tie region.

The tub-tie region 160 comprises an n-type buried pedestal portion 162 and a p-type cap portion 161. The cap portion 161 surrounds at least a top section of the pedestal portion 162. Illustratively, the cap portion includes a relatively highly doped central section 161.2 and a more lightly doped peripheral section(s) 161.1, all of which are p-type. In principle, however, only one peripheral section 161.1 is needed to establish electrical connectivity to the tub 146. Thus, even if the left hand peripheral section were n-type, allowing the pedestal portion to pinch-off the conducting path between isolating region 122 and pedestal portion 162, the right hand peripheral section would still provide the needed connectivity between the cap portion 161 and the tub 146. Note, of course, the peripheral sections could be part of a cylindrical structure, in which case the left and right-handedness exists only in cross-section.

Figure 2A:
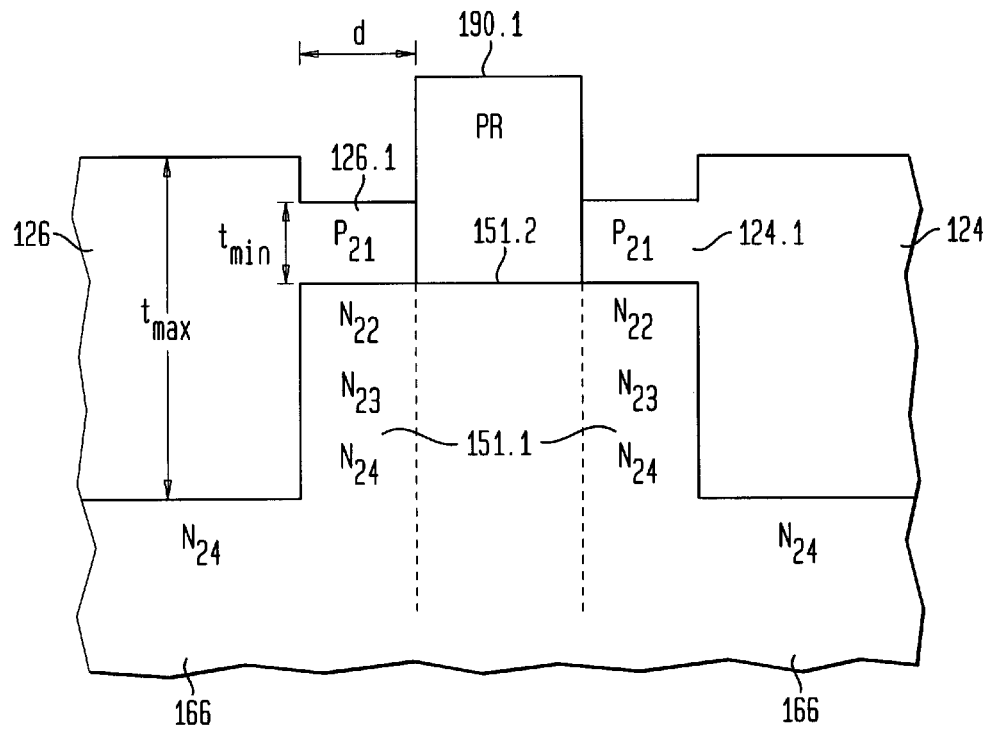
Figure 2B:
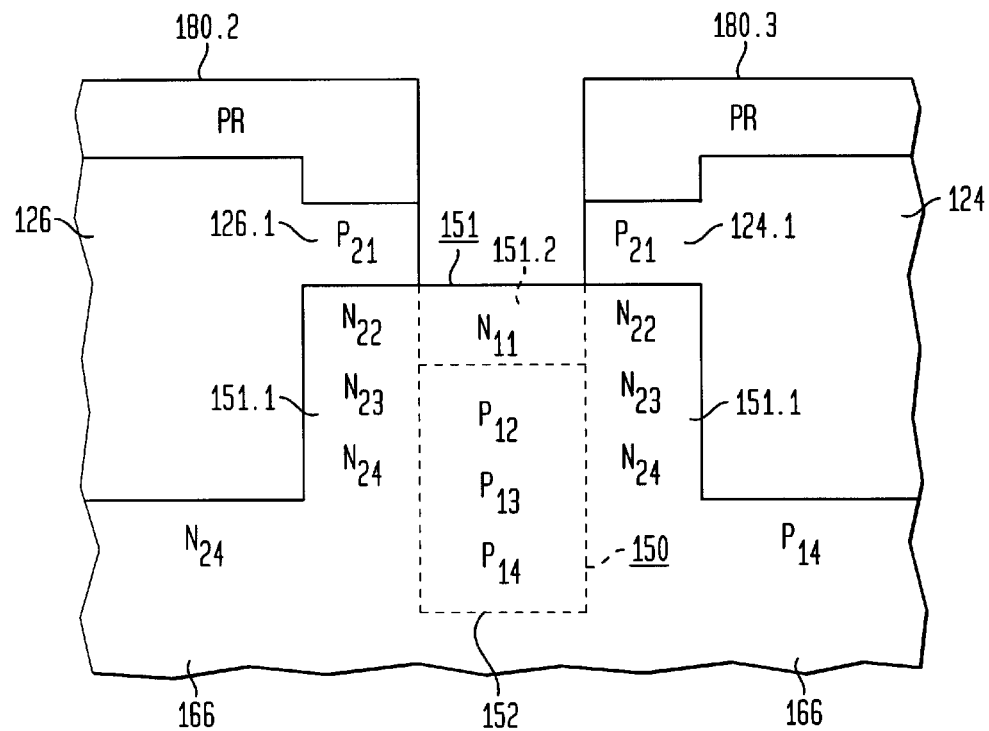

Similarly, FIG. 2B depicts an n-type tub-tie of the same design as the p-type tub-tie of FIG. 1B, except that the conductivity types have been reversed.

The tub-tie structure of FIGS. 1 and 2 can be realized utilizing a variety of IC fabrication processes, such as LOCOS and STI. However, in general the process exploits the shape of the isolating regions 120, 122, 124 and 126 to selectively dope the raised semiconductor feature 110.1 to produce the desired cap portions 151 and 161. In particular, the thickness of the isolating regions in various parts thereof (e.g., in the protrusions 120.1, 122.1, 124.1 and 126.1) are controlled to impede penetration of implanted ions of a first conductivity type (e.g., n-type), yet permit penetration of ions of a second conductivity type (e.g., p-type).

The Gossmann-Vuong patent adopts the notation $P_{ij}$ (i=1, 2; j=1,2,3, ... ) and $N_{ij}$ (i=1,2; j=1,2,3, ... ) to indicate that certain regions are either p-type ($P_{ij}$) or n-type ($N_{ij}$), with the subscript i designating first and second fabrication cycles, and the subscripts j designating that different regions may have different dopant concentrations and/or may have been implanted with dopants during different steps in the IC fabrication process.

Consider first FIGS. 1A and 2B which depict p-type and n-type tub-ties, respectively, during a first stage of the tub-tie fabrication process. After the raised feature 110.1 is formed in the semiconductor body 110 and after the isolating regions 120, 122, 124 and 126 are also formed so as to have the desired protrusions 120.1, 122.1, 124.1 and 126.1, respectively, a mask (e.g., PR) is deposited on the wafer. The mask is patterned so that mask segment 180.1 (FIG. 1A) blocks the opening between the protrusions 120.1 and 122.1 of the p-type tub-tie (FIG. 1A) and mask segments 180.2 and 180.3 cover the isolating regions 126 and 124, including the protrusions 126.1 and 124.1 of the n-type tub-tie (FIG. 2B). During a first cycle of ion implantation steps, mask 180.1 blocks ions from penetrating the underlying semiconductor of the p-type tub-tie (FIG. 1A) where the central section 161.2 of the cap portion 161 will be formed. An implantation cycle is defined as a sequence of ion implantation steps and possibly other steps (e.g., etching) but with no intervening photolithography step (e.g., PR step). During the same cycle, the central section 151.2 and the pedestal portion 152 of the n-type tub-tie (FIG. 2B) are implanted. The converse situation holds for FIGS. 1B and 2A during a second implantation cycle.

Taking a front-end CMOS process as an illustration, the Gossmann-Vuong patent describes, in conjunction with FIGS. 1–2, the fabrication of tub-ties to both the PMOS and NMOS transistors. The first implantation cycle would typically include a relatively shallow implantation $N_{11}$ of the n⁺-type source/drain/extension (S/D) regions (not shown) of the NMOS transistors. Extension regions include well-known LDD (lightly doped drain) and MDD (moderately doped drain) regions. As shown in FIG. 1A, the thickness $t_{min}$ of protrusions 120.1 and 122.1 and the implant energies are mutually adapted to impede (essentially prevent) penetration of the $N_{11}$ implant into the underlying semiconductor raised feature 110.1 of the p-type tub-tie (FIG. 1A); i.e., the $N_{11}$ implant is absorbed by the protrusions (as well as by the adjacent thicker sections $t_{max}$ of the isolating regions). Implant $N_{11}$ also forms central section 151.2 of the cap portion 152 of the n-type tub-tie (FIG. 2B), but the mask segments 180.2 and 180.3 and the isolating regions prevent penetration of the n⁺-type dopant into the peripheral sections 151.1 of the cap portion 151 (FIG. 2B). The first cycle also includes a multiplicity of p⁻⁻-type implants $P_{12}$, $P_{13}$ and $P_{14}$. These implants are performed at higher energies sufficient to penetrate through the protrusions into the peripheral sections 161.1 of the p-type tub-tie (FIG. 1A). However, the thickness $t_{max}$ of the isolating regions is sufficiently large to prevent penetration of the $P_{12}$ and $P_{13}$ implants therethrough, but not the $P_{14}$ implant. Illustratively, implant $P_{14}$ is a higher energy implant than $P_{13}$, implant $P_{13}$ is a higher energy implant than $P_{12}$, and $P_{12}$ is a higher energy implant than $N_{11}$. Typically, $P_{14}$ represents a p⁻⁻-type tub implant, whereas $P_{12}$ and $P_{13}$ represent a variety of well-known NMOS transistor implants (e.g., a valley-fill implant, a punch-through implant, and a threshold-adjust implant). The order of these implants need not follow any particular sequence; in particular, the sequence $N_{11}$, $P_{12}$, $P_{13}$ and $P_{14}$ is merely illustrative, not mandatory. The first cycle implants $P_{12}$, $P_{13}$ and $P_{14}$ also form the p⁻⁻-type pedestal portion 152 of the n-type tub-tie (FIG. 2B).

After the end of the first implantation cycle, the mask 180.1 is removed exposing the underlying semiconductor of the p-type tub-tie, in particular exposing the central section 161.2 of the cap portion 161 (FIG. 1B). In addition, another mask (e.g., PR) is formed over the wafer. This mask includes mask segments 190.2 and 190.3 over the isolating regions 120 and 122 (FIG. 1B) and a mask segment 190.1 blocking the opening between protrusions 126.1 and 124.1 of the n-type tub-tie (FIG. 2A). Mask segments 190.2 and 190.3 (FIG. 1B) prevent ions implanted during the second cycle from penetrating through the protrusions 120.1 and 122.1, whereas mask segment 190.1 (FIG. 2A) prevents implantation in the region where the central section 151.2 of the cap portion 151 of the n-type tub-tie is to be formed. The second cycle includes implantation $P_{21}$ of the p⁺-type S/D/extension regions of the PMOS transistors (not shown) and, simultaneously, of the p⁺-type central section 161.2 of the cap portion 161 (FIG. 1B). In addition, the second cycle includes a multiplicity of higher energy n⁻⁻-type implants $N_{22}$, $N_{23}$ and $N_{24}$, corresponding to various implants associated with the fabrication of PMOS transistors. For example, $N_{24}$ represents the n⁻⁻-type tub implant, whereas $N_{22}$ and $N_{23}$ represent a variety of well-known PMOS transistor n⁻-type implants (e.g., a valley-fill implant, a punch-through implant, and a threshold-adjust implant, all functionally similar to those described above for the NMOS transistors). The second cycle implants $N_{22}$, $N_{23}$ and $N_{24}$ also form the n⁻⁻-type pedestal portion 162 of the p-type tub tie (FIG. 1B), as well as the peripheral portions 151.1 of the n-type tub-tie (FIG. 2A).

The shape of the isolating regions 120, 122, 124 and 126 may be formed and or approximated in a variety of ways. As for material composition, these regions may comprise, for example, an oxide of the underlying semiconductor (e.g., SiO$_2$) or a combination of such an oxide and PR. (PR would be utilized for processing only, and would not be incorporated into the final IC.) As for the shape of the protrusion, a precise rectangle as depicted in the schematic drawing of FIGS. 1–2 is not essential. The protrusion may be triangular, tapered or irregular; its edges may be straight or curved. For example, the bird's beak shape of the field oxide (FOX) thermally grown by a well known LOCOS process may be utilized to approximate the shape of the protrusions 120.1, 122.1, 124.1 and 126.1 and to achieve the desired shape of the cap and pedestal portions of the tub-tie region.

Alternatively, the tub-tie design may be realized as part of a modified STI process. For example, after oxide-filled trenches are formed in a semiconductor (e.g., Si) body, the oxide overlays the entire surface of the body, including the semiconductor pillars between adjacent trenches. A tub-tie region is formed in one or more of the pillars. The desired protrusions are achieved by depositing PR over the oxide, forming openings in the PR where the central section (e.g., sections 151.2 and 161.2 of FIGS. 1B and 2B, respectively) is to be formed, and then etching (e.g., RIE) away the exposed oxide. Compared to a LOCOS process, this STI process has an extra PR mask step.

In addition, if the photolithographic masks used to form, for example, protrusion 122.1 of the tub-tie region for NMOS transistors (FIGS. 1A and 1B) are not properly aligned with one another, or if the etching process associated with the photolithography is not precisely controlled even if the masks are properly aligned, then the protrusion may not have the proper shape (e.g., thickness) to keep the N$_{11}$ implant from penetrating into the underlying semiconductor and causing pinch-off between the pedestal region 162 and the isolating region 122. Similar comments apply to the protrusions 120.1, 124.1 and 126.1.

Moreover, in this tub-tie design the pedestals 162 and 152 (FIGS. 1B and 2B) are electrically floating; i.e., they are not in ohmic contact with the tub-tie electrode (not shown). As such they tend to accumulate charge, which can result in an unpredictable transient behavior of the IC.

Preferred Embodiment

In accordance with one aspect of our invention, a reduced-mask-count process for fabricating STI CMOS ICs includes: (1) a first photolithographic masking (e.g., PR) step in which an opening in the mask is aligned with the tub-tie region, and the n$^+$-type source/drain/extension regions are ion-planted at an acute (preferably non-zero) angle −α and p-type tub regions are ion-implanted at an acute (non-zero) angle +β (both angles measured relative to the normal to the top surface of the IC wafer), and (2) a second photolithographic masking (e.g., PR) step in which an opening in the mask is intentionally misaligned with respect to the tub-tie region so that at least one edge of the opening overlaps a peripheral surface portion of the tub-tie region, and the p$^+$-type source/drain/extension regions are ion-implanted at an acute (preferably non-zero) angle −α, whereas the n-type tub regions are ion-implanted at an acute (non-zero) +β (again both angles measured relative to the normal to the top surface of the IC wafer). The angles α and β need not be equal to one another. Moreover, they are typically small angles, illustratively about 6–8°.

One effect of our process is to create a localized first zone in the peripheral surface portion. For example, for NMOS transistors (FIGS. 3A–3C) this localized zone is shaded from the n-type implants but is exposed to the p$^+$-type implants, thereby insuring that the n-type pedestal portion of the tub-tie does not extend to the TROX regions around the entire perimeter (e.g., circumference) of the tub-tie region. For PMOS transistors similar comments apply but, of course, with opposite conductivity-type regions. This p$^+$-type zone is much more highly doped than the region P$_{12}$ of the Gossmann-Vuong patent, and the corresponding n$^+$-type zone (not shown) is likewise more highly doped than the region N$_{22}$ of the Gossmann-Vuong patent. Relatively high doping levels in these zones also prevent compensation and counter-doping when the pedestal regions are implanted.

Figure 3A:
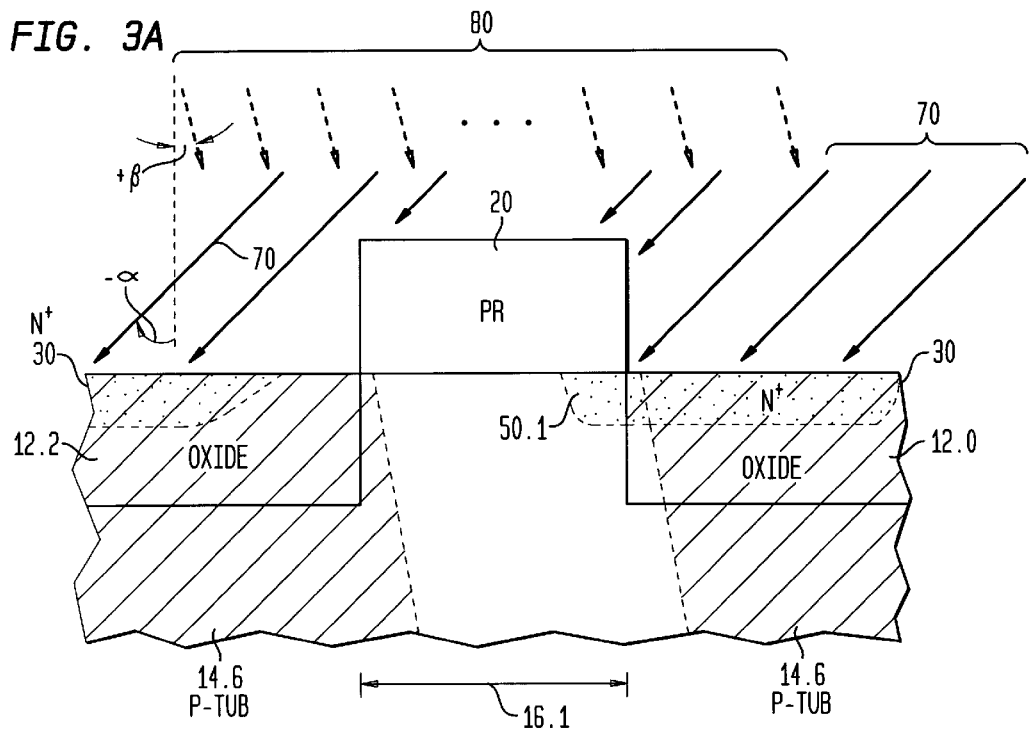
FIGS. 3A–3C are schematic, cross-sectional views of a portion of a CMOS IC depicting a tub-tie design (used to tie the p-type tub of the NMOS transistors) in accordance with all illustrative embodiment of our invention.
Figure 3B:
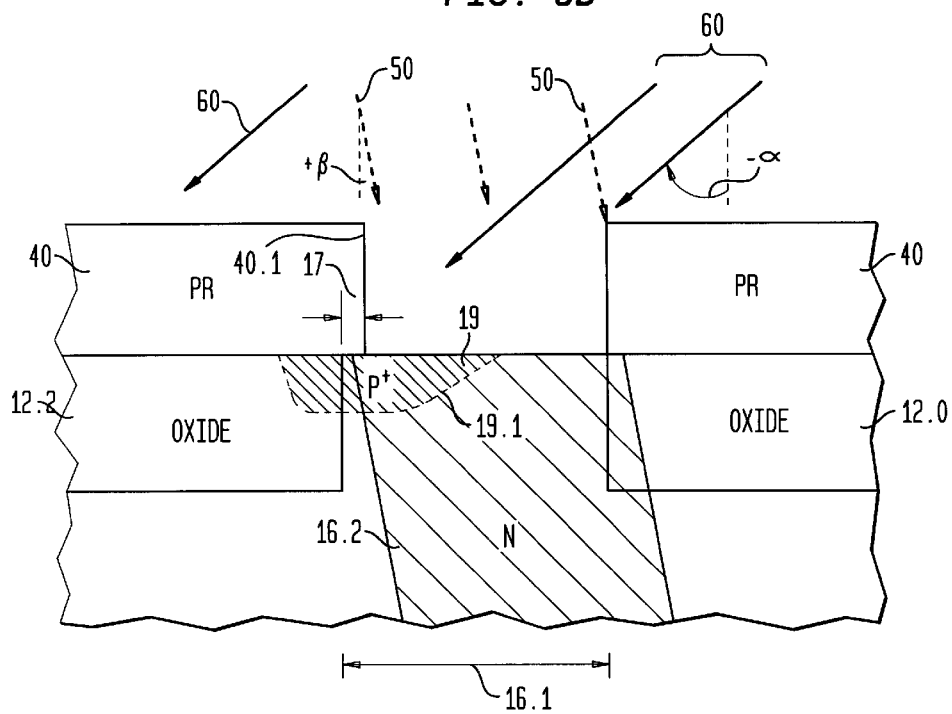
Figure 3C:
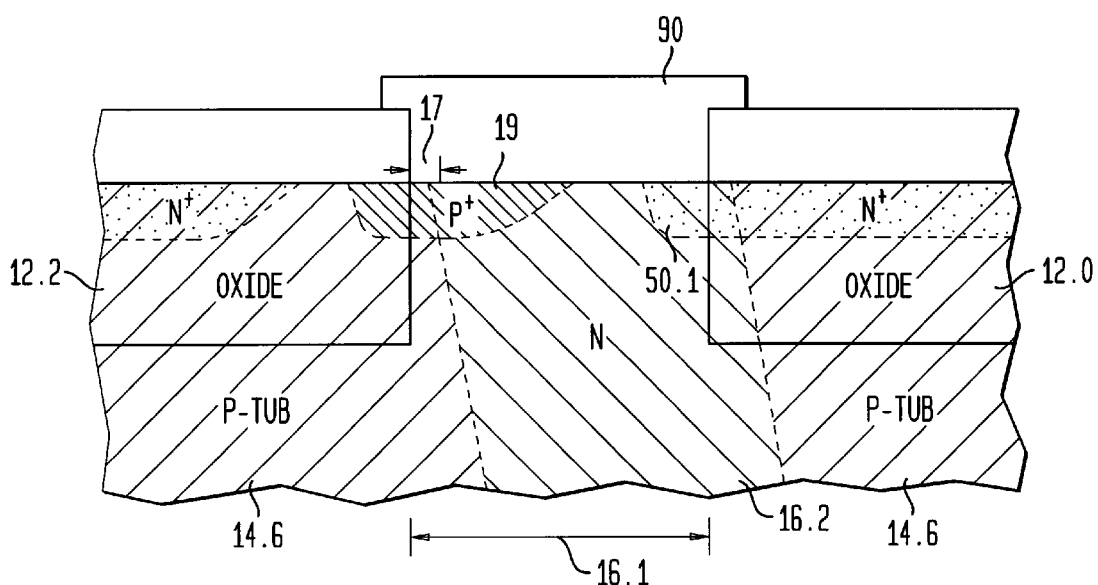

More specifically, we show in FIG. 3C a tub-tie region of a NMOS transistor, which may be part of a CMOS IC. The tub-tie region is formed between a pair of separated TROX regions 12.0 and 12.2 as viewed in cross-section. Buried p-type tub regions 14.6 are disposed beneath the TROX regions. Significantly, in this embodiment of our invention, the IC is fabricated to have two cooperating features: (1) a peripheral surface portion 17 of the tub-tie region that is free of n-type dopant from the source/drain/extension implant, and (2) a localized p$^+$-type zone 19 that overlaps the peripheral portion 17. The combination of these features reduces the likelihood that the n-type pedestal portion 16.2 extends to the TROX region 12.2 around its entire perimeter, and thus decreases the likelihood of pinch-off.

These features are preferably realized in two photolithographic masking steps as depicted in FIGS. 3A and 3B for the case of tub-ties for NMOS transistors. A corresponding description, with opposite conductivity-type regions, would apply to PMOS transistors. FIG. 3B depicts one photolithographic masking step and two ion-implantation steps: (1) A low energy, shallow p$^+$-type implant 60 used to form p$^+$-type localized first zone 19 as well as the p$^+$-type source/drain/ extension regions (not shown) of PMOS transistors. This implant takes place at an acute (preferably non-zero) angle −α. Consequently, the interface 19.1 between the first zone 19 and the pedestal portion 16.2 is oriented at approximately the acute angle α, and (2) A higher energy, deeper n-type implant 50 used to form the n-type pedestal portion 16.2 as well as the n-type tubs (not shown) of the PMOS transistors. This implant takes place at an acute (non-zero) angle +β. Likewise, FIG. 3A depicts another photolithographic masking step and two more ion-implantation steps: (1) A low energy, shallow n$^+$-type implant 70 [at an acute (preferably non-zero) angle −α] used to form n$^+$-type source/drain/ extension regions (not shown) of NMOS transistors, and (2) a higher energy, deeper p-type implant 80 [at an acute (non-zero) angle +β] used to from p-type tubs 14.6 of the NMOS transistors.

All implants are broad area implants; i.e., they impact essentially the entire top surface of the wafer. Thus, for example, while the n$^+$-type source/drain/extension regions are being formed in certain areas of the wafer (determined by the specific IC design), other unmasked areas of the wafer (e.g., in the TROX 12.2 and 12.0 in FIG. 3A) also are subjected to ion-implantation (e.g., resulting in the shallow implants designated 30 in FIG. 3A).

In accordance with one feature of our invention, FIG. 3B depicts that the opening in mask 40 is intentionally misaligned with respect to the tub-tie region 16.1 so that one edge 40.1 overlaps a peripheral surface portion 17. This feature of NMOS transistor tub-ties, in combination with the orientation of the n-type implant 50 at an acute (non-zero) angle +β, insures that the n-type dopants do not penetrate the peripheral portion 17, which is a first step in reducing the likelihood of pinch-off. In contrast, FIG. 3A depicts that mask 20 is aligned (i.e., in registration) with and covers tub-tie region 16.1. A low energy, shallow $n^+$-type implant 70 [at an acute (preferably non-zero) angle −α] forms the source/drain/extension regions (not shown) of NMOS transistors and penetrates into TROX regions 12.0 and 12.2 as shown at 30. A peripheral second zone 30.1 of this $n^+$-type implant extends into the tub-tie region 16.1. The penetration of $n^+$-type zone 30.1 is a feature of another embodiment of our invention and requires that the implant angle α be non-zero. This feature alleviates charge build-up in the pedestal region 16.2. More specifically, the n-type pedestal portion 16.2 of our tub-tie region does not electrically float. Rather, the $n^+$-type zone 30.1 provides ohmic contact between the pedestal portion 16.2 and the electrode 90. Note, although the pedestal itself directly contacts electrode 90, this contact is often a Schottky barrier since the doping level of the pedestal portion is relatively low. Illustratively, zones 19 and 30.1 have doping concentrations in the range of about $1\times10^{19}$ cm$^{-3}$ to $2\times10^{21}$ cm$^{-}$, whereas pedestal portion 16.2 has a doping concentration in the range of about $1\times10^{16}$ cm$^{-3}$ to $3\times10^{18}$ cm$^{-3}$. Thus, zone 30.1 insures that the contact between pedestal portion 16.2 and electrode 90 is ohmic. Similar comments apply to the tub-tie region of PMOS transistors (not shown).

In addition, FIG. 3A shows a higher energy, deeper p-type implant 80 used to form the p-type tubs 14.6 of the PMOS transistors.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

What is claimed is:

1. A process for making an IC comprising:
   (a) forming a multiplicity of trench isolation regions in a surface of a semiconductor body, and
   (b) forming a tub-tie region between at least one pair of adjacent ones of said isolating regions (as viewed in cross-section) including the steps of:
      (b1) forming a first photolithographic mask that covers and is in registration with said tub-tie region,
      (b2) implanting ions of a first conductivity type to form a tub region adjacent said tub-tie region,
      (b3) removing said first mask,
      (b4) forming a second photolithographic mask that has an opening that exposes most of the underlying tub-tie region but overlaps a first peripheral region on one side of said tub-tie region,
      (b5) implanting ions to form a pedestal region of a second conductivity-type within said tub-tie region, and
      (b6) implanting ions of said first conductivity-type at an acute angle −α to the normal to said surface so as to form a first conductivity-type, highly doped, localized first zone that extends into said first peripheral region.

2. The invention of claim 1 including after step (b6) the step of forming an electrode to said tub-tie region and including between steps (b1) and (b3) the step of implanting ions of said second conductivity type at an acute angle −α to the normal to said surface so as to form a second conductivity-type, highly doped, localized second zone that extends into a second peripheral region that makes ohmic contact between said electrode and said pedestal region.

3. The invention of claim 1 wherein said first conductivity-type tub of step (b2) and said second conductivity-type pedestal of step (b5) are formed by implanting ions at an acute (non-zero) +β to the normal to said surface.

* * * * *